US012660692B2

(12) United States Patent
Sun

(10) Patent No.: US 12,660,692 B2
(45) Date of Patent: Jun. 16, 2026

(54) SEMICONDUCTOR PACKAGE ASSEMBLY AND MANUFACTURING METHOD

(71) Applicant: CHANGXIN MEMORY TECHNOLOGIES, INC., Hefei City (CN)

(72) Inventor: Xiaofei Sun, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 900 days.

(21) Appl. No.: 17/952,404

(22) Filed: Sep. 26, 2022

(65) Prior Publication Data

US 2023/0014357 A1      Jan. 19, 2023

Related U.S. Application Data

(63) Continuation of application No. PCT/CN2022/110303, filed on Aug. 4, 2022.

(30) Foreign Application Priority Data

Jul. 8, 2022      (CN) ......................... 202210806540.3

(51) Int. Cl.
H10W 90/00          (2026.01)
H10W 70/05          (2026.01)
(Continued)

(52) U.S. Cl.
CPC ........... H10W 90/00 (2026.01); H10W 70/05 (2026.01); H10W 70/20 (2026.01);
(Continued)

(58) Field of Classification Search
CPC ...... H01L 25/105; H01L 21/56; H10W 90/00; H10W 70/05; H10W 70/20
See application file for complete search history.

(56) References Cited

U.S. PATENT DOCUMENTS 7,026,709 B2      4/2006   Tsai et al.
7,354,800 B2      4/2008   Carson
(Continued)

FOREIGN PATENT DOCUMENTS

CN          1731917 A       2/2006
CN          101075596 A      11/2007
(Continued)

OTHER PUBLICATIONS

Japanese Patent Office, Office Action Issued in Application No. 2022-562492, Sep. 3, 2024, 2 pages.
(Continued)

*Primary Examiner* — Errol V Fernandes
(74) *Attorney, Agent, or Firm* — Intellectual Valley Law, P.C.

(57)          ABSTRACT

A semiconductor package assembly and a manufacturing method are provided. The semiconductor package assembly includes: a base plate having a first surface; a first chip structure located on the base plate and electrically connected to the first surface of the base plate; an intermediary layer having a first interconnection surface; and a molding compound. The first interconnection surface has a first and second interconnection regions. A first solder ball is formed on the first interconnection region. A first pad is formed on the second interconnection region. The intermediary layer is electrically connected to the first surface by means of the first pad. The molding compound seals the first chip structure, the intermediary layer and the first surface. The first solder ball has a surface exposed from the molding compound. There is a preset height between the exposed surface of the first solder ball and the first interconnection surface.

16 Claims, 18 Drawing Sheets

(51) Int. Cl.

| | | |
|---|---|---|
| *H10W 70/20* | (2026.01) |
| *H10W 70/60* | (2026.01) |
| *H10W 70/685* | (2026.01) |
| *H10W 74/01* | (2026.01) |
| *H10W 74/10* | (2026.01) |

(52) U.S. Cl.

CPC ........ *H10W 70/611* (2026.01); *H10W 70/685* (2026.01); *H10W 74/01* (2026.01); *H10W 74/117* (2026.01); *H10W 90/701* (2026.01); *H10W 90/751* (2026.01)

(56) References Cited

U.S. PATENT DOCUMENTS

| | | | |
|---|---|---|---|
| 7,723,159 | B2 | 5/2010 | Do et al. |
| 7,800,211 | B2 | 9/2010 | Yang et al. |
| 7,927,917 | B2 | 4/2011 | Pagaila |
| 8,198,735 | B2 | 6/2012 | Chow et al. |
| 8,227,925 | B2 | 7/2012 | Song et al. |
| 8,309,397 | B2 | 11/2012 | Shim et al. |
| 8,699,232 | B2 | 4/2014 | Choi et al. |
| 8,962,393 | B2 | 2/2015 | Pagaila et al. |
| 9,595,509 | B1 | 3/2017 | Yap |
| 10,410,968 | B2 | 9/2019 | Park |
| 11,211,334 | B2 | 12/2021 | Lin et al. |
| 2003/0219969 | A1 | 11/2003 | Saito et al. |
| 2004/0145039 | A1 | 7/2004 | Shim et al. |
| 2005/0023657 | A1 | 2/2005 | Tsai et al. |
| 2008/0157325 | A1 | 7/2008 | Chow et al. |
| 2008/0227238 | A1 | 9/2008 | Ko et al. |
| 2009/0001540 | A1 | 1/2009 | Yang et al. |
| 2009/0079091 | A1 | 3/2009 | Song et al. |
| 2009/0085225 | A1 | 4/2009 | Park |
| 2009/0091015 | A1 | 4/2009 | Shen et al. |
| 2009/0236718 | A1 | 9/2009 | Yang |
| 2009/0243068 | A1 | 10/2009 | Kuan et al. |
| 2010/0046183 | A1 | 2/2010 | Park et al. |
| 2010/0072593 | A1 | 3/2010 | Kim et al. |
| 2010/0148354 | A1 | 6/2010 | Choi et al. |
| 2010/0244221 | A1 | 9/2010 | Ko et al. |
| 2010/0258930 | A1 | 10/2010 | Oh |
| 2010/0301466 | A1 | 12/2010 | Taoka et al. |
| 2010/0320582 | A1 | 12/2010 | Pagaila |
| 2011/0062591 | A1 | 3/2011 | Choi et al. |
| 2011/0127662 | A1 | 6/2011 | Yang et al. |
| 2011/0133325 | A1* | 6/2011 | Moon ..................... H01L 24/16 257/E21.511 |
| 2011/0193205 | A1 | 8/2011 | Hsieh |
| 2012/0146243 | A1 | 6/2012 | Song et al. |
| 2012/0217645 | A1 | 8/2012 | Pagaila |
| 2012/0319267 | A1 | 12/2012 | Moon et al. |
| 2013/0075889 | A1 | 3/2013 | Pagaila et al. |
| 2014/0103527 | A1 | 4/2014 | Marimuthu et al. |
| 2014/0291821 | A1 | 10/2014 | Song |
| 2015/0102506 | A1 | 4/2015 | Song et al. |
| 2015/0115466 | A1 | 4/2015 | Kim |
| 2015/0270232 | A1 | 9/2015 | Chen et al. |
| 2016/0172337 | A1 | 6/2016 | Kim |
| 2016/0343691 | A1 | 11/2016 | Chen et al. |
| 2017/0069607 | A1 | 3/2017 | Yap |
| 2017/0141043 | A1 | 5/2017 | Park |
| 2017/0228529 | A1 | 8/2017 | Huang et al. |
| 2018/0005974 | A1 | 1/2018 | Chiu et al. |
| 2019/0013299 | A1 | 1/2019 | Lee |
| 2019/0252772 | A1 | 8/2019 | Ndip et al. |
| 2019/0296002 | A1 | 9/2019 | Pei et al. |
| 2019/0378826 | A1 | 12/2019 | Kim |
| 2020/0020637 | A1 | 1/2020 | Kim et al. |
| 2020/0066663 | A1 | 2/2020 | Aleksov et al. |
| 2020/0194331 | A1 | 6/2020 | Kim et al. |
| 2020/0312783 | A1 | 10/2020 | Min et al. |
| 2020/0381406 | A1 | 12/2020 | Dominguez et al. |
| 2021/0035895 | A1 | 2/2021 | Oh et al. |
| 2021/0035913 | A1 | 2/2021 | Park et al. |
| 2021/0050294 | A1 | 2/2021 | Tsai et al. |
| 2021/0343617 | A1 | 11/2021 | Kim et al. |
| 2021/0351172 | A1 | 11/2021 | Pei et al. |
| 2022/0122896 | A1 | 4/2022 | Wang et al. |
| 2022/0130764 | A1 | 4/2022 | Lin et al. |
| 2022/0199593 | A1 | 6/2022 | Yang et al. |
| 2023/0052194 | A1 | 2/2023 | Kim et al. |

FOREIGN PATENT DOCUMENTS

| | | |
|---|---|---|
| CN | 103219296 A | 7/2013 |
| CN | 204102862 U | 1/2015 |
| CN | 104576557 A | 4/2015 |
| CN | 105161435 A | 12/2015 |
| CN | 103219296 B | 4/2016 |
| CN | 106711094 A | 5/2017 |
| CN | 107527877 A | 12/2017 |
| CN | 104576557 B | 8/2018 |
| CN | 110581121 A | 12/2019 |
| CN | 110718528 A | 1/2020 |
| CN | 110797325 A | 2/2020 |
| CN | 111819689 A | 10/2020 |
| CN | 113113318 A | 7/2021 |
| JP | 60160645 A | 8/1985 |
| JP | 2002217331 A | 8/2002 |
| JP | 2004172157 A | 6/2004 |
| JP | 2005026680 A | 1/2005 |
| JP | 2010212605 A | 9/2010 |
| JP | 2011233672 A | 11/2011 |
| KR | 100890073 B1 | 3/2009 |
| KR | 20090091486 A | 8/2009 |
| KR | 1020090091487 A | 8/2009 |
| KR | 20170094483 A | 8/2017 |
| KR | 20180004658 A | 1/2018 |
| KR | 20190093194 A | 8/2019 |
| KR | 20210016216 A | 2/2021 |
| TW | 200950132 A | 12/2009 |
| TW | 201128748 A | 8/2011 |
| TW | 201314812 A | 4/2013 |
| TW | 201415586 A | 4/2014 |
| TW | 201532234 A | 8/2015 |
| TW | 201620102 A | 6/2016 |
| TW | 202044520 A | 12/2020 |
| TW | 202101685 A | 1/2021 |
| TW | 202109800 A | 3/2021 |
| TW | M627599 U | 6/2022 |

OTHER PUBLICATIONS

Japanese Patent Office, Office Action Issued in Application No. 2022-563494, Oct. 1, 2024, 9 pages.

Japanese Patent Office, Office Action Issued in Application No. 2022-566266, Oct. 8, 2024, 10 pages.

Japanese Patent Office, Office Action Issued in Application No. 2022-562587, Oct. 15, 2024, 8 pages.

Supplementary European Search Report cited in EP22790428.1, mailed Feb. 27, 2024, 18 pages.

Decision of Refusal issued in Japanese corresponding application No. 2022-562492 mailed on Apr. 22, 2025, 8 pages.

Non-final Office Action issued in U.S. Appl. No. 18/152,188 mailed on May 20, 2025, 14 pages.

Non-final Office Action issued in US corresponding U.S. Appl. No. 17/951,722 mailed on Jun. 11, 2025, 13 pages.

Search Report issued in Singaporean corresponding application No. 11202254069A mailed on May 23, 2025, 2 pages.

Written Opinion issued in Singaporean corresponding application No. 11202254069A mailed on Jun. 26, 2025, 7 pages.

First Office Action of the Taiwanese application No. 111134125, issued on Apr. 26, 2023, 8 pages with English translation.

Korean Intellectual Property Office, Office Action Issued in Application No. 10-2022-7041847, Mar. 29, 2024, 16 pages.

Korean Intellectual Property Office, Office Action Issued in Application No. 10-2022-7040844, Mar. 29, 2024, 16 pages.

Non-final Office Action issued in U.S. Appl. No. 18/166,465 mailed on Oct. 2, 2025, 7 pages.

The Communication pursuant to Article 94(3) EPC issued in European corresponding application No. 22793375.1 mailed on Oct. 15, 2025, 5 pages.

(56) References Cited

OTHER PUBLICATIONS

Non-final Office Action issued in U.S. Appl. No. 18/154,739 mailed
on Feb. 5, 2026, 9 pages.

* cited by examiner

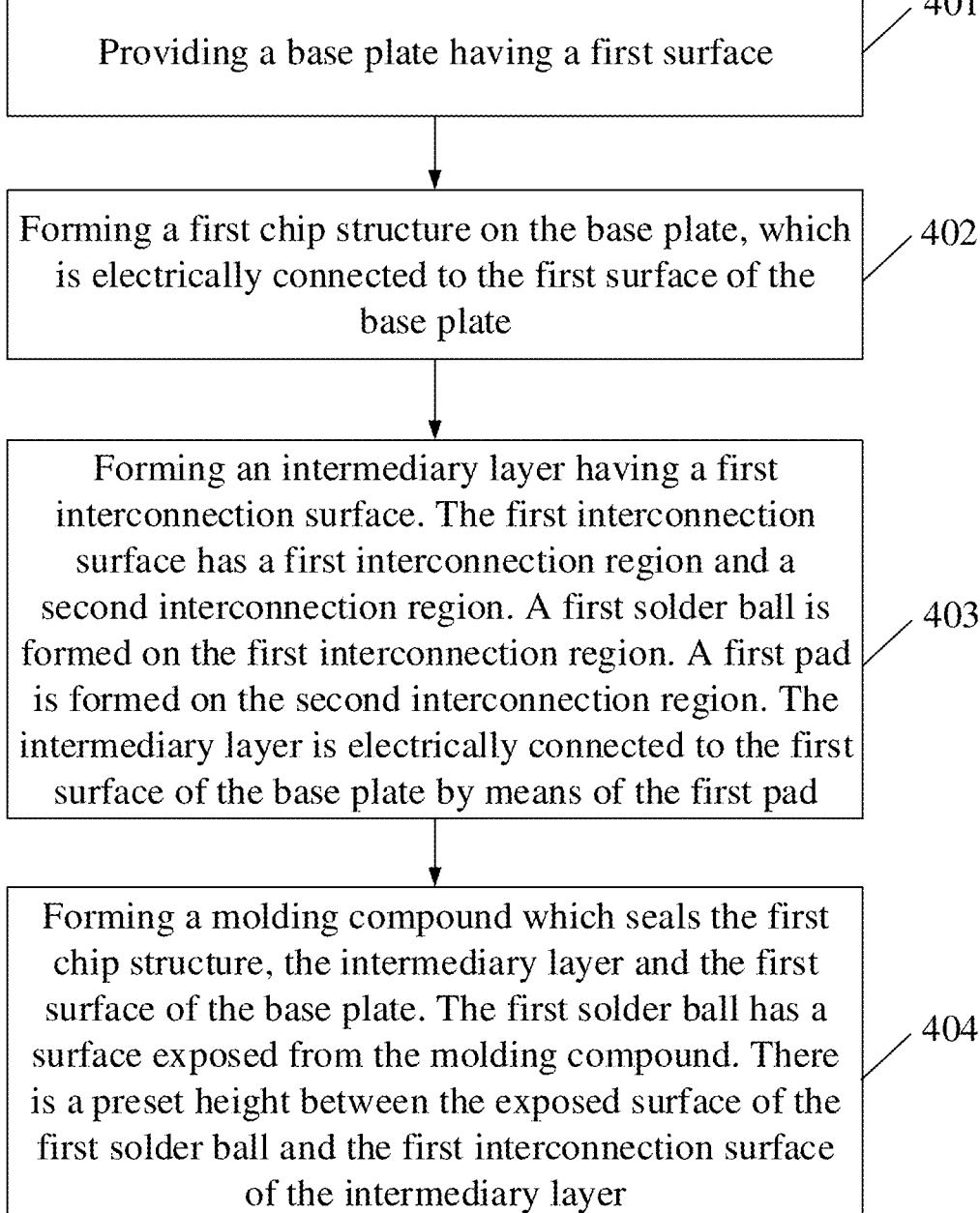

Providing a base plate having a first surface ⟋401

Forming a first chip structure on the base plate, which is electrically connected to the first surface of the base plate ⟋402

Forming an intermediary layer having a first interconnection surface. The first interconnection surface has a first interconnection region and a second interconnection region. A first solder ball is formed on the first interconnection region. A first pad is formed on the second interconnection region. The intermediary layer is electrically connected to the first surface of the base plate by means of the first pad ⟋403

Forming a molding compound which seals the first chip structure, the intermediary layer and the first surface of the base plate. The first solder ball has a surface exposed from the molding compound. There is a preset height between the exposed surface of the first solder ball and the first interconnection surface of the intermediary layer ⟋404

FIG. 4

SEMICONDUCTOR PACKAGE ASSEMBLY AND MANUFACTURING METHOD

CROSS-REFERENCE TO RELATED APPLICATIONS

The present application is a U.S. continuation application of International Application No. PCT/CN2022/110303, filed on Aug. 4, 2022, which claims priority to Chinese Patent Application No. 202210806540.3, filed on Jul. 8, 2022. International Application No. PCT/CN2022/110303 and Chinese Patent Application No. 202210806540.3 are incorporated herein by reference in their entireties.

BACKGROUND

In the electronics industry, lighter, faster, smaller, multifunctional, more reliable and more cost-effective products are continually required all over the sectors, industries and regions. In order to meet these growing requirements of various consumers, more circuits are required to be integrated to provide the desired functions. In almost all applications, there is a growing requirement for reducing sizes, enhancing performances and improving the functions of the integrated circuits.

SUMMARY

In view of this, embodiments of the disclosure provide a semiconductor package assembly and a manufacturing method.

A first aspect of the embodiments of the disclosure provides a semiconductor package assembly, including a base plate, a first chip structure, an intermediary layer and a molding compound.

The base plate has a first surface.

The first chip structure is located on the base plate and electrically connected to the first surface of the base plate.

The intermediary layer has a first interconnection surface. The first interconnection surface has a first interconnection region and a second interconnection region. A first solder ball is formed on the first interconnection region. A first pad is formed on the second interconnection region. The intermediary layer is electrically connected to the first surface of the base plate by means of the first pad.

The molding compound seals the first chip structure, the intermediary layer and the first surface of the base plate. The first solder ball has a surface exposed from the molding compound. There is a preset height between the exposed surface of the first solder ball and the first interconnection surface of the intermediary layer.

A second aspect of the embodiments of the disclosure provides a method for manufacturing a semiconductor package assembly, including the following operations.

A base plate is provided, and the base plate has a first surface.

A first chip structure is formed on the base plate, and the first chip structure is electrically connected to the first surface of the base plate.

An intermediary layer is formed, and the intermediary layer has a first interconnection surface. The first interconnection surface has a first interconnection region and a second interconnection region. A first solder ball is formed on the first interconnection region. A first pad is formed on the second interconnection region. The intermediary layer is electrically connected to the first surface of the base plate by means of the first pad.

A molding compound is formed, and the molding compound seals the first chip structure, the intermediary layer and the first surface of the base plate. The first solder ball has a surface exposed from the molding compound. There is a preset height between the exposed surface of the first solder ball and the first interconnection surface of the intermediary layer.

BRIEF DESCRIPTION OF THE DRAWINGS

In order to more clearly illustrate the technical solutions in the embodiments of the disclosure or conventional technologies, the drawings used for the description of the embodiments will be briefly described below. It is apparent that the drawings in the following descriptions are merely some embodiments of the disclosure. Other drawings can be obtained by those skilled in the art according to these drawings without any creative work.

FIG. 4 is a schematic flowchart of a method for manufacturing a semiconductor package assembly according to an embodiment of the disclosure.

DETAILED DESCRIPTION

Figure 1:
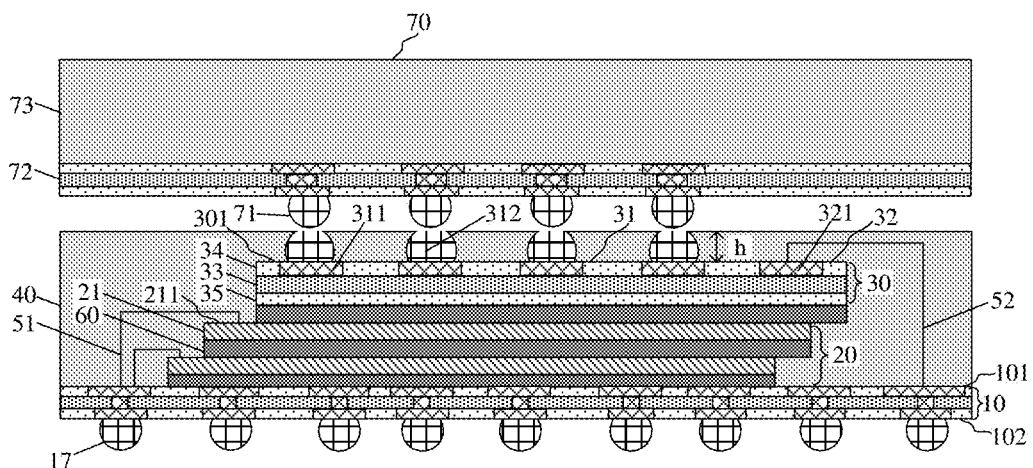
FIG. 1 is a schematic structural diagram of a semiconductor package assembly according to an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more fully understanding of the disclosure, and to completely convey a scope disclosed by the disclosure to a person skilled in the art.

In the following descriptions, a lot of specific details are given in order to provide the more fully understanding of the disclosure. However, it is apparent to a person skilled in the art that the disclosure may be implemented without one or more of these details. In other examples, in order to avoid confusion with the disclosure, some technical features well-known in the field are not described. Namely, not all of the features of an actual embodiments are described here, and well-known functions and structures are not described in detail.

In the drawings, the sizes of a layer, a region, and an element and their relative sizes may be magnified for clarity. The same reference sign represents the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

In order to fully understand the disclosure, detailed steps and detailed structures are presented in the following description, so as to explain the technical solutions of the disclosure. Preferred embodiments of the disclosure are described in detail below, however, the disclosure may have other implementations in addition to these detailed descriptions.

Based on this, an embodiment of the disclosure provides a semiconductor package assembly. FIG. 1 is a schematic structural diagram of a semiconductor package assembly according to an embodiment of the disclosure.

Referring to FIG. 1, the semiconductor package assembly includes a base plate 10, a first chip structure 20, an intermediary layer 30 and a molding compound 40.

The base plate 10 has a first surface 101.

The first chip structure 20 is located on the base plate 10 and electrically connected to the first surface 101 of the base plate 10.

The intermediary layer 30 has a first interconnection surface 301. The first interconnection surface 301 has a first interconnection region 31 and a second interconnection region 32. A first solder ball 312 is formed on the first interconnection region 31. A first pad 321 is formed on the second interconnection region 32. The intermediary layer 30 is electrically connected to the first surface 101 of the base plate 10 by means of the first pad 321.

The molding compound 40 seals the first chip structure 20, the intermediary layer 30 and the first surface 101 of the base plate 10. The first solder ball 312 has a surface exposed from the molding compound 40. There is a preset height h between the exposed surface of the first solder ball 312 and the first interconnection surface 301 of the intermediary layer 30.

In this embodiment of the disclosure, through the arrangement of the intermediary layer, the second package structure to be formed subsequently may be connected to the first chip structure and the base plate by means of the first solder ball on the intermediary layer. In this embodiment of the disclosure, the intermediary layer may be a structure formed by a non-organic material, for example, a silicon intermediary layer, or by one or more organic materials. Through the arrangement of the intermediary layer, interconnection between the structures of different types or different specifications can be achieved, such that a combination of different structures can be more flexible. In addition, since the first chip structure and the second package structure are packaged separately, it is easier to perform testing and failure analysis.

In an embodiment of the disclosure, there is the preset height h between the top surface of the first solder ball and the first interconnection surface. The preset height h is not less than $\frac{1}{5}$-$\frac{1}{2}$ of a thickness of the intermediary layer. In some embodiments, if the thickness of the intermediary layer is 100-200 μm, the preset height h is 50-120 μm. In this way, a stress problem caused by different thermal expansion coefficients between the molding compound and the intermediary layer can be effectively suppressed. Therefore, it is guaranteed that the package structure has a relatively thin overall thickness, while the entire package structure can have relatively good bonding force with the second package structure to be formed subsequently.

Figure 2:
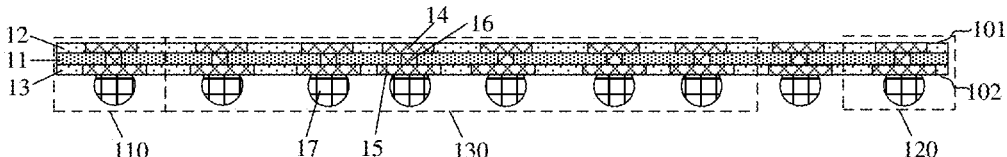
FIG. 2 is a schematic structural diagram of a base plate according to an embodiment of the disclosure.

FIG. 2 is a schematic structural diagram of a base plate according to an embodiment of the disclosure.

In some embodiments, the base plate 10 may be a Printed Circuit Board (PCB) or a redistribution base plate.

Referring to FIG. 2, the base plate 10 includes a base plate substrate 11, and an upper insulating dielectric layer 12 of the base plate and a lower insulating dielectric layer 13 of the base plate that are respectively disposed on an upper surface and a lower surface of the base plate substrate 11.

The base plate substrate 11 may be a silicon substrate, a germanium substrate, a silicon germanium substrate, a silicon carbide substrate, a Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as Silicon Germanium On Insulator (SGOI).

The upper insulating dielectric layer 12 of the base plate and the lower insulating dielectric layer 13 of the base plate may be solder mask layers. For example, materials of the upper insulating dielectric layer 12 of the base plate and the lower insulating dielectric layer 13 of the base plate may be green paint.

In this embodiment of the disclosure, the first surface 101 of the base plate 10 is an upper surface of the upper insulating dielectric layer 12 of the base plate. The base plate 10 further includes a second surface 102 opposite to the first surface 101. The second surface 102 is a lower surface of the lower insulating dielectric layer 13 of the base plate.

The base plate 10 further includes an upper connection pad 14 of the base plate located in the upper insulating dielectric layer 12 of the base plate, a lower connection pad 15 of the base plate located in the lower insulating dielectric layer 13 of the base plate, and a connection via 16 of the base plate that penetrates the base plate substrate 11 and connects the upper connection pad 14 of the base plate and the lower connection pad 15 of the base plate.

Materials of the upper connection pad 14 of base plate and the lower connection pad 15 of the base plate may include at least one of aluminum, copper, nickel, tungsten, platinum, or gold. The connection via 16 of the base plate may be a Through-Silicon-Via (TSV).

The base plate 10 further includes a connection bump 17 of the base plate. The connection bump 17 of the base plate is located on the second surface 102 of the base plate 10. The connection bump 17 of the base plate may electrically connect the semiconductor package assembly to an external apparatus, so that at least one of a control signal, a power signal or a grounding signal that are used to operate the first chip structure may be received from the external apparatus, or a data signal to be stored in the first chip structure may be received from the external apparatus, or data in the first chip structure may also be provided to the external apparatus.

The connection bump 17 of the base plate includes a conductive material. In the embodiment of the disclosure shown in FIG. 2, the connection bump 17 of the base plate is a solder ball. It is to be understood that, a shape of the connection bump of the base plate provided in this embodiment of the disclosure is only a specific and feasible implementation in the embodiments of the disclosure, and does not constitute a limitation to the disclosure. The connection bump of the base plate may also be a structure with other shapes. The number, spacing, and location of the connection bumps of the base plate are not limited to any specific arrangement, and various modifications may be made.

Continuously referring to FIG. 2, the base plate 10 further includes a first signal transmission region 110 and a second signal transmission region 120 that are respectively located on two opposite ends of the base plate 10. The first signal transmission region 110 is electrically connected to the first chip structure 20. The second signal transmission region 120 is electrically connected to the intermediary layer 30.

The base plate 10 further includes a third signal transmission region 130 located between the first signal transmission region 110 and the second signal transmission region 120. The first chip structure 20 is located on the third signal transmission region 130.

Figure 3:
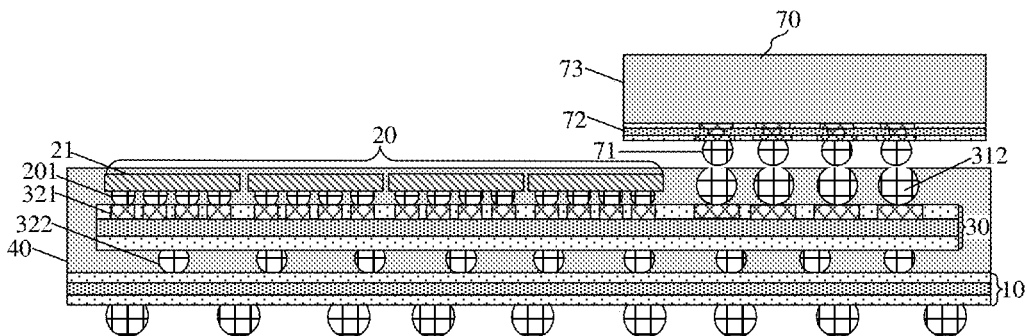
FIG. 3 is a schematic structural diagram of a semiconductor package assembly according to another embodiment of the disclosure.

In the embodiments of the disclosure, there are two situations in a positional relationship between the first chip structure and the intermediary layer. One situation is that, as shown in FIG. 1, the intermediary layer 30 is located above the first chip structure 20; and the other situation is that, as shown in FIG. 3, the first chip structure 20 is located above the intermediary layer 30.

In the embodiment shown in FIG. 1, the first chip structure 20 includes a plurality of first semiconductor chips 21 that are successively stacked in a direction perpendicular to the base plate 10. The intermediary layer 30 is located above the first chip structure 20.

In this embodiment, by means of successively stacking the plurality of first semiconductor chips upwards, a horizontal area of the semiconductor package assembly can be saved.

The first semiconductor chip may be a DRAM chip or another type of semiconductor chip.

Continuously referring to FIG. 1, the semiconductor package assembly further includes a first conductive wire 51 and a second conductive wire 52.

Each first semiconductor chip 21 is electrically connected to the base plate 10 by means of the first conductive wire 51.

The second interconnection region 32 is electrically connected to the base plate 10 by means of the second conductive wire 52.

Specifically, the first semiconductor chip 21 has a first connection end 211. The first connection end 211 and the first signal transmission region 110 are located on the same side. The first conductive wire 51 is led out from the first connection end 211 and connected to the first signal transmission region 110, so as to achieve an electric connection between the first semiconductor chip 21 and the base plate 10.

A first pad 321 is formed on the second interconnection region 32. The second conductive wire 52 is led out from the first pad 321 and connected to the second signal transmission region 120, so as to achieve an electric connection between the intermediary layer 30 and the base plate 10.

In the embodiments of the disclosure, a method for electrically connecting the first chip structure to the base plate by means of wire bonding includes an overhang manner and a Film on Wire (FOW) manner.

In the embodiment shown in FIG. 1, wire bonding is performed by means of the overhang manner. The two adjacent first semiconductor chips 21 are connected to each other by means of an adhesive film 60. The adhesive film 60 does not cover the first connection end 211 and the first conductive wire 51 on the first semiconductor chip 21 under the adhesive film. The adhesive film 60 is misaligned with the first semiconductor chip 21 under the adhesive film.

In some other embodiments, wire bonding (not shown) is performed by means of the FOW manner. The plurality of first semiconductor chips are aligned along a direction perpendicular to the base plate. The adhesive film between the two adjacent first semiconductor chips covers the first connection end and the first conductive wire on the first semiconductor chip under the adhesive film.

It is to be understood that, in this embodiment of the disclosure, the electric connection by means of lead wires is only a specific and feasible implementation in the embodiments of the disclosure, and does not constitute a limitation to the disclosure. The electric connection may also be achieved by means of other manners, for example, hybrid bonding or bump interconnection.

Continuously referring to FIG. 1, the intermediary layer 30 includes an intermediary substrate 33, and an intermediary upper insulating dielectric layer 34 and an intermediary lower insulating dielectric layer 35 that are respectively disposed on an upper surface and a lower surface of the intermediary substrate 33.

The intermediary substrate 33 may be a silicon substrate, a germanium substrate, a silicon germanium substrate, a silicon carbide substrate, a SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

The intermediary upper insulating dielectric layer 34 and the intermediary lower insulating dielectric layer 35 may be solder mask layers. For example, materials of the intermediary upper insulating dielectric layer 34 and the intermediary lower insulating dielectric layer 35 may be green paint.

A plurality of second pads 311 are formed on the first interconnection region 31 of the intermediary layer 30. The number of the first pads 321 is greater than the number of the second pads 311. An area of the first pad 321 is less than an area of the second pad 311.

Since the second pad is configured to be mated and connected to the second package structure subsequently, the layout design of the second pad is relatively fixed. The first pad is configured to achieve the interconnection between the second package structure and the base plate, so that the layout design of the first pad is more flexible. By providing the first pads with a larger number and a smaller area, the signal transmission efficiency can be enhanced.

Materials of the first pad 321 and the second pad 311 may include at least one of aluminum, copper, nickel, tungsten, platinum, or gold.

In the embodiment shown in FIG. 3, the first chip structure 20 includes a plurality of first semiconductor chips 21 that are successively stacked in a direction parallel to the base plate 10. The first chip structure 20 is located above the intermediary layer 30.

In this embodiment, by means of successively disposing the plurality of first semiconductor chips in a horizontal direction, a package height of the semiconductor package assembly can be reduced.

Continuously referring to FIG. 3, the semiconductor package assembly further includes: a first conductive block 201, located between the first semiconductor chip 21 and the intermediary layer 30, where each first semiconductor chip 21 is electrically connected to the base plate 10 by means of the first conductive block 201; and a second conductive block 322, located between the intermediary layer 30 and the base plate 10. The intermediary layer 30 is electrically connected to the base plate 10 by means of the second conductive block 322.

In this embodiment, the first semiconductor chip is connected to the intermediary layer by means of the first conductive block, and the intermediary layer is connected to the base plate, so that the first semiconductor chip is connected to the base plate by means of the first conductive block and the intermediary layer.

In an embodiment, the area of the first pad 321 is greater than the area of the second pad 311.

In the embodiment shown in FIG. 3, since the intermediary layer is directly connected to the base plate, the second interconnection region does not need to be used for the communication between other package structures and the base plate, so that the first pad may be formed by a metal with a large area to increase a heat dissipation area, thereby enhancing heat dissipation efficiency.

In an embodiment, referring to FIG. 1, the semiconductor package assembly further includes: a second package structure 70. The second package structure 70 includes a second solder ball 71 and is electrically connected to the first solder ball 312 by means of the second solder ball 71.

In an embodiment, a volume of the first solder ball 312 is greater than a volume of the second solder ball 71. Through such a configuration, the lateral flow of a solder can be prevented during the subsequent reflow soldering of the first solder ball 312 and the second solder ball 71, so that the risk of short circuit between the adjacent solder balls can be reduced, and the bonding strength between the first solder ball and the second solder ball can be improved.

In the direction perpendicular to the base plate 10, the molding compound 40 has a first thickness. The second package structure 70 includes a second molding compound 73. In the direction perpendicular to the base plate 10, the second molding compound 73 has a second thickness. The first thickness is greater than or equal to the second thickness. Since the thickness of the molding compound 40 is relatively large, the second package structure can be fully supported, so that the warping of a first package structure toward the second package structure can be prevented.

The second package structure 70 further includes a second base plate 72. A structure of the second base plate 72 may be the same or different from a structure of the base plate 10, which is not described herein again.

The second package structure includes a second chip structure (not shown). The second chip structure may be a Universal File Store (UFS) chip.

The semiconductor package assembly provided in the embodiments of the disclosure is applicable to UFS Multi Chip Package (UMCP) of a Package on Package (PoP) structure.

In the embodiments of the disclosure, a top surface of the molding compound is coplanar to a top surface of the first solder ball. In this way, when the molding compound is formed, a normal packaging mold may be used for packaging, without forming a special-shaped packaging mold. The special-shaped packaging mold needs a high manufacturing cost and is more complicated in process. Therefore, the semiconductor package assembly provided in the embodiments of the disclosure can reduce cost, and simplify the formation process.

An embodiment of the disclosure further provides a method for manufacturing a semiconductor package assembly. Referring to FIG. 4 for details, as shown in the figure, the method includes the following steps.

At S401, a base plate is provided. The base plate has a first surface.

At S402, a first chip structure is formed on the base plate. The first chip structure is electrically connected to the first surface of the base plate.

At S403, an intermediary layer is formed. The intermediary layer has a first interconnection surface. The first interconnection surface has a first interconnection region and a second interconnection region. A first solder ball is formed on the first interconnection region. A first pad is formed on the second interconnection region. The intermediary layer is electrically connected to the first surface of the base plate by means of the first pad.

At S404, a molding compound is formed. The molding compound seals the first chip structure, the intermediary layer and the first surface of the base plate. The first solder ball has a surface exposed from the molding compound. There is a preset height between the exposed surface of the first solder ball and the first interconnection surface of the intermediary layer.

The method for manufacturing a semiconductor package assembly provided in the embodiments of the disclosure is further described in detail below with reference to specific embodiments.

FIG. 5A to FIG. 5H are schematic structural diagrams during manufacturing a semiconductor package assembly according to an embodiment of the disclosure. FIG. 6A to FIG. 6E are schematic structural diagrams during manufacturing a semiconductor package assembly according to another embodiment of the disclosure. It is to be noted that, in the method for manufacturing a semiconductor package assembly shown in FIG. 5A to FIG. 5H, the first chip structure is first formed, and then the intermediary layer is formed. In the method for manufacturing a semiconductor package assembly shown in FIG. 6A to FIG. 6E, the intermediary layer is first formed, and then the first chip structure is formed.

First referring to FIG. 5A to FIG. 5H, one of the embodiments of the method for manufacturing a semiconductor package assembly is described in detail.

Figure 5A:
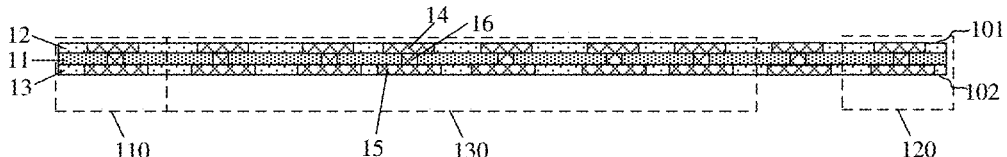
FIG. 5A to FIG. 5H are schematic structural diagrams during manufacturing a semiconductor package assembly according to an embodiment of the disclosure.

First referring to FIG. 5A, S401 of providing the base plate 10 is executed. The base plate 10 has a first surface 101.

In some embodiments, the base plate 10 may be a PCB or a redistribution base plate.

The base plate 10 includes a base plate substrate 11, and an upper insulating dielectric layer 12 of the base plate and a lower insulating dielectric layer 13 of the base plate that are respectively disposed on an upper surface and a lower surface of the base plate substrate 11.

The base plate substrate 11 may be a silicon substrate, a germanium substrate, a silicon germanium substrate, a silicon carbide substrate, a SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

The upper insulating dielectric layer 12 of the base plate and the lower insulating dielectric layer 13 of the base plate may be solder mask layers. For example, materials of the upper insulating dielectric layer 12 of the base plate and the lower insulating dielectric layer 13 of the base plate may be green paint.

In this embodiment of the disclosure, the first surface 101 of the base plate 10 is an upper surface of the upper insulating dielectric layer 12 of the base plate. The base plate 10 further includes a second surface 102 opposite to the first surface 101. The second surface 102 is a lower surface of the lower insulating dielectric layer 13 of the base plate.

The base plate 10 further includes an upper connection pad 14 of the base plate located in the upper insulating dielectric layer 12 of the base plate, a lower connection pad 15 of the base plate located in the lower insulating dielectric layer 13 of the base plate, and a connection via 16 of the base plate that penetrates the base plate substrate 11 and connects the upper connection pad 14 of the base plate and the lower connection pad 15 of the base plate.

Materials of the upper connection pad 14 of the base plate and the lower connection pad 15 of the base plate may include at least one of aluminum, copper, nickel, tungsten, platinum, or gold. The connection via 16 of the base plate may be a Through-Silicon-Via (TSV).

The base plate 10 further includes a first signal transmission region 110 and a second signal transmission region 120 that are respectively located on two opposite ends of the base plate 10. The first signal transmission region 110 is electrically connected to the first chip structure to be formed subsequently. The second signal transmission region 120 is electrically connected to the intermediary layer to be formed subsequently.

In some embodiments, the first signal transmission region 110 and the second signal transmission region 120 are not connected to each other.

The base plate 10 further includes a third signal transmission region 130 located between the first signal transmission region 110 and the second signal transmission region 120. The first chip structure is located on the third signal transmission region 130.

In some embodiments, the first signal transmission region 110 and the third signal transmission region 130 are connected to each other. The third signal transmission region 130 and the second signal transmission region 120 are not connected to each other.

Figure 5B:
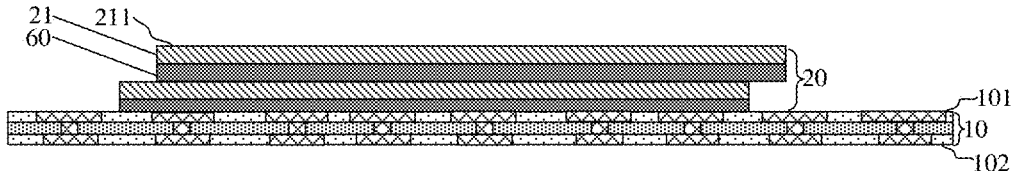

Next, referring to FIG. 5B, S402 of forming the first chip structure 20 on the base plate 10 is executed. The first chip structure 20 is electrically connected to the first surface 101 of the base plate 10.

In an embodiment, the step of forming the first chip structure 20 includes: in a direction perpendicular to the base plate 10, forming a plurality of first semiconductor chips 21 that are successively stacked. In this embodiment, by means of successively stacking the plurality of first semiconductor chips upwards, a horizontal area of the semiconductor package assembly can be saved.

Specifically, the adhesive film 60 is first formed on the base plate 10, and the first chip structure 20 is formed on the adhesive film 60. The two adjacent first semiconductor chips 21 are connected to each other by means of the adhesive film 60.

Figure 5C:
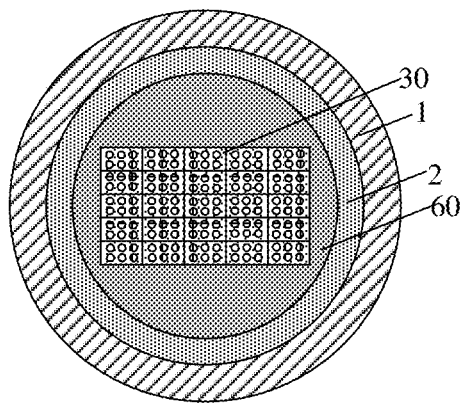
Figure 5D:
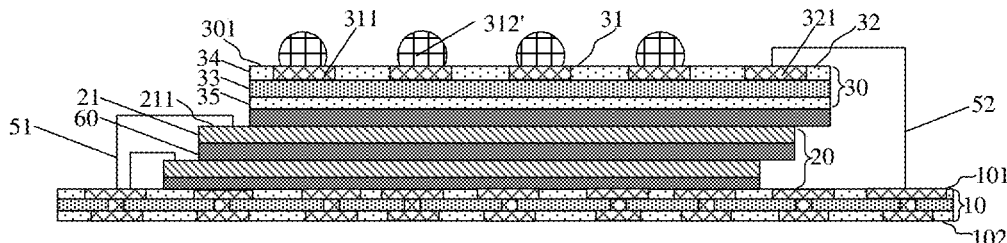

Next, referring to FIG. 5C to FIG. 5D, S403 of forming the intermediary layer 30 is executed. The intermediary layer 30 has a first interconnection surface 301. The first interconnection surface 301 has a first interconnection region 31 and a second interconnection region 32. A first solder ball 312 is formed on the first interconnection region 31. A first pad 321 is formed on the second interconnection region 32. The intermediary layer 30 is electrically connected to the first surface 101 of the base plate 10 by means of the first pad 321.

Specifically, referring to FIG. 5C first, a carrier tape 2 is pasted on a circular ring 1. The adhesive film 60 is then pasted on the carrier tape 2. Then, the intermediary layer is pasted on the adhesive film 60. At this time, the entire intermediary layer is in a strip shape. The intermediary layer is cut to form units shown in FIG. 5C.

Next, referring to FIG. 5D, the intermediary layer 30 is formed on the first chip structure 20.

Specifically, a single intermediary layer 30 formed in FIG. 5C is pasted on the first chip structure 20.

In an embodiment of the disclosure, as shown in FIG. 5D, an initial first solder ball 312' is first formed on the first interconnection region 31 of the intermediary layer 30. The first solder ball 312 is subsequently formed through etching or grinding. The initial first solder ball 312' has an initial height in a direction perpendicular to the intermediary layer 30.

The intermediary layer 30 includes an intermediary substrate 33, and an intermediary upper insulating dielectric layer 34 and an intermediary lower insulating dielectric layer 35 that are respectively disposed on an upper surface and a lower surface of the intermediary substrate 33.

The intermediary substrate 33 may be a silicon substrate, a germanium substrate, a silicon germanium substrate, a silicon carbide substrate, a SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

The intermediary upper insulating dielectric layer 34 and the intermediary lower insulating dielectric layer 35 may be solder mask layers. For example, materials of the intermediary upper insulating dielectric layer 34 and the intermediary lower insulating dielectric layer 35 may be green paint.

Continuously referring to FIG. 5D, the method further includes: forming a plurality of second pads 311 on the first interconnection region 31. The number of the first pads 321 is greater than the number of the second pads 311. An area of the first pad 321 is less than an area of the second pad 311.

Since the second pad is configured to be mated and connected to the second package structure subsequently, the layout design of the second pad is relatively fixed. The first pad is configured to achieve the interconnection between the second package structure and the base plate, so that the layout design of the first pad is more flexible. By providing the first pad with a larger number and a smaller area, the signal transmission efficiency can be enhanced.

Materials of the first pad 321 and the second pad 311 may include at least one of aluminum, copper, nickel, tungsten, platinum, or gold.

Continuously referring to FIG. 5D, the method further includes: after forming the intermediary layer 30, forming a first conductive wire 51, where each first semiconductor chip 21 is electrically connected to the base plate 10 by means of the first conductive wire 51; and forming a second conductive wire 52, where the second interconnection region 32 is electrically connected to the base plate 10 by means of the second conductive wire 52.

Specifically, a first connection end 211 is formed on the first semiconductor chip 21. The first connection end 211 and the first signal transmission region 110 are located at the same side. The first conductive wire 51 is led out from the first connection end 211 and connected to the first signal transmission region 110, so as to achieve an electric connection between the first semiconductor chip 21 and the base plate 10.

A first pad 321 is formed on the second interconnection region 32. The second conductive wire 52 is led out from the first pad 321 and connected to the second signal transmission region 120, so as to achieve an electric connection between the intermediary layer 30 and the base plate 10.

Figure 5E:
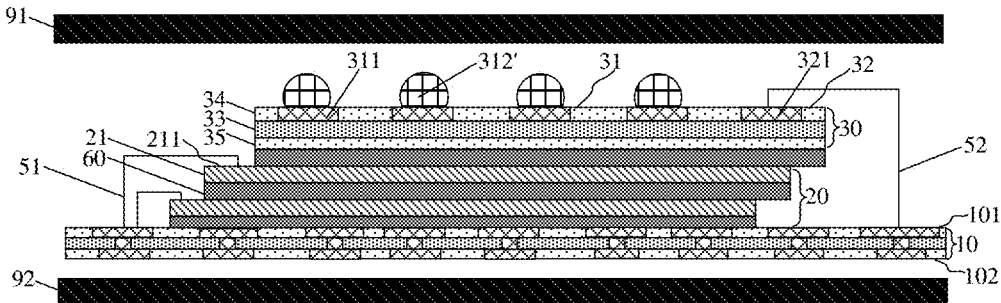
Figure 5F:
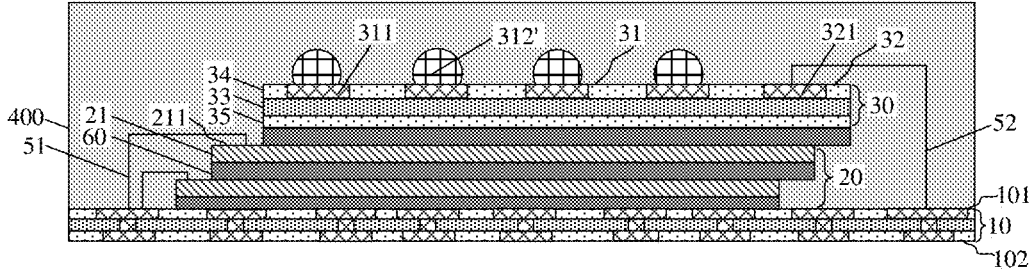
Figure 5G:
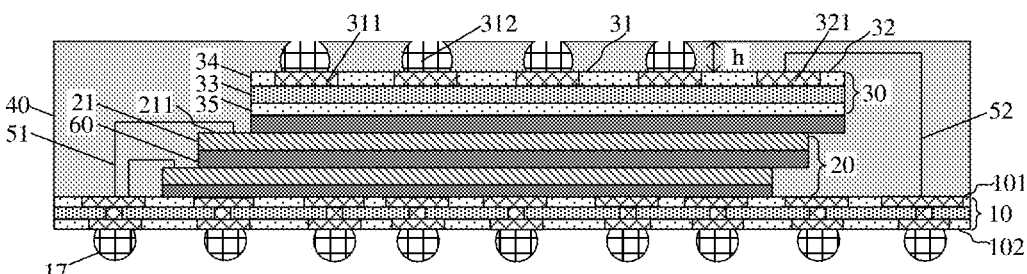

Next, referring to FIG. 5E to FIG. 5G, S404 of forming the molding compound 40 is executed. The molding compound 40 seals the first chip structure 20, the intermediary layer 30 and the first surface 101 of the base plate 10. The first solder ball 312 has a surface exposed from the molding compound 40. There is a preset height h between the exposed surface of the first solder ball 312 and the first interconnection surface 301 of the intermediary layer 30.

The step of forming the molding compound 40 includes the following operations.

A first packaging mold 91 is formed. A surface of the first packaging mold 91 is parallel to a surface of the base plate 10. The first packaging mold 91 is located above the first chip structure 20 and the intermediary layer 30, and there is a certain distance from the first packaging mold 91 to the first chip structure 20 and the intermediary layer 30.

A molding compound pre-layer 400 is formed with the first packaging mold 91 used as a mask.

Part of the molding compound pre-layer 400 is removed by means of etching, to form the molding compound 40, and expose a surface of the first solder ball 312.

Specifically, referring to FIG. 5E first, the first packaging mold 91 is formed above the first chip structure 20 and the intermediary layer 30. A second packaging mold 92 is formed under the base plate 10. The second packaging mold 92 is parallel to the surface of the base plate 10.

Next, referring to FIG. 5F, the first packaging mold 91 and the second packaging mold 92 are used as masks, and the molding compound pre-layer 400 is formed between the first packaging mold 91 and the second packaging mold 92.

The molding compound pre-layer 400 completely covers the first surface of the base plate 10, the first chip structure 20, the intermediary layer 30, and the initial first solder ball 312' on the intermediary layer 30.

The method further includes: after the molding compound pre-layer 400 is formed, removing the first packaging mold 91 and the second packaging mold 92.

Next, referring to FIG. 5G, part of the molding compound pre-layer 400 is removed, to form the molding compound 40, and expose the surface of the first solder ball 312.

Specifically, the surface of the molding compound pre-layer 400 may be polished by using a grinding wheel, to remove part of the molding compound pre-layer 400 and remove part of the initial first solder ball 312', so as to form the first solder ball 312 with the preset height h.

In the embodiments of the disclosure, since the first solder ball is formed on the first interconnection region, the first interconnection region is not required to be exposed, so that the special-shaped packaging mold is not required to be used, and only the first packaging mold with a normal shape is required to be used. As the first packaging mold is simple in shape, a manufacturing process is simple, and cost is relative low.

Continuously referring to FIG. 5G, after the molding compound 40 is formed, the connection bump 17 of the base plate is formed on the second surface 102 of the base plate 10. The connection bump 17 of the base plate includes a conductive material.

Figure 5H:
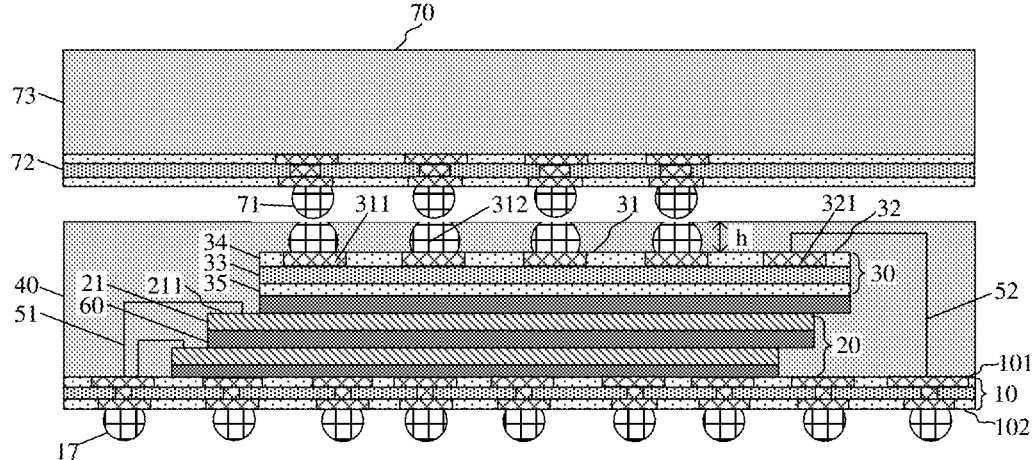

Next, referring to FIG. 5H, a second package structure 70 is formed. The second package structure 70 includes a second solder ball 71 and is electrically connected to the first solder ball 312 by means of the second solder ball 71.

In an embodiment, a volume of the first solder ball 312 is greater than a volume of the second solder ball 71. Through such a configuration, the lateral flow of a solder can be prevented during the subsequent reflow soldering of the first solder ball 312 and the second solder ball 71, so that the risk of short circuit between the adjacent solder balls can be reduced, and the bonding strength between the first solder ball and the second solder ball can be improved.

In the direction perpendicular to the base plate 10, the molding compound 40 has a first thickness. The second package structure 70 includes a second molding compound 73. In the direction perpendicular to the base plate 10, the second molding compound 73 has a second thickness. The first thickness is greater than or equal to the second thickness. Since the thickness of the molding compound 40 is relatively large, the second package structure can be fully supported, so that the warping of a first package structure toward the second package structure can be prevented.

The second package structure 70 further includes a second base plate 72. A structure of the second base plate 72 may be the same or different from a structure of the base plate 10, which is not described herein again.

Next, referring to FIG. 6A to FIG. 6F, another embodiment of the method for manufacturing a semiconductor package assembly is described in detail.

It is to be noted that, the base plate shown in FIG. 6A to FIG. 6F is similar to the base plate shown in FIG. 5A to FIG. 5H, which is not described herein again.

Figure 6A:
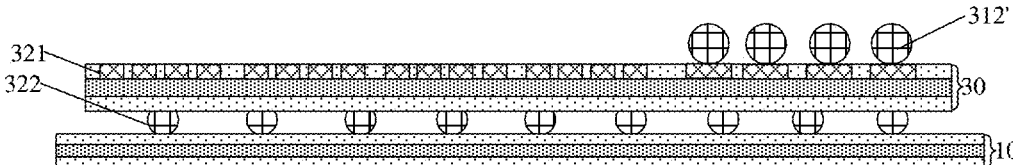
FIG. 6A to FIG. 6F are schematic structural diagrams during manufacturing a semiconductor package assembly according to another embodiment of the disclosure.

First, referring to FIG. 6A, after the base plate 10 is formed, a second conductive block 322 is formed on the base plate 10, and the intermediary layer 30 is formed on the second conductive block 322. The intermediary layer 30 is electrically connected to the base plate 10 by means of the second conductive block 322.

In an embodiment, the area of the first pad 321 is greater than the area of the second pad 311.

In the embodiment shown in FIG. 3, since the intermediary layer is directly connected to the base plate, the second interconnection region does not need to be used for the communication between other package structures and the base plate, so that the first pad may be formed by a metal with a large area to increase a heat dissipation area, thereby enhancing heat dissipation efficiency.

Figure 6B:
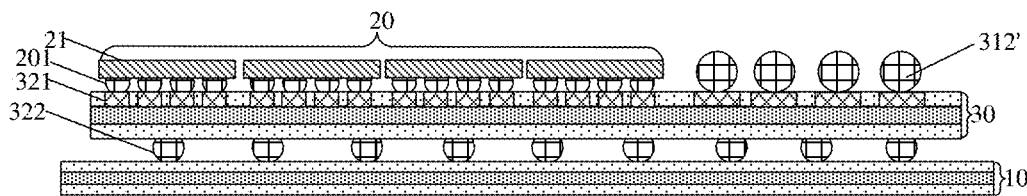

Next, referring to FIG. 6B, the first chip structure 20 is formed on the intermediary layer 30. The step of forming the first chip structure 20 includes: in a direction parallel to the base plate 10, forming a plurality of first semiconductor chips 21 that are successively arranged.

Specifically, after the intermediary layer 30 is formed, a first conductive block 201 is formed on the intermediary layer 30, and the first chip structure 20 is formed on the first conductive block 201. Each first semiconductor chip 21 is electrically connected to the base plate 10 by means of the first conductive block 201.

Figure 6C:
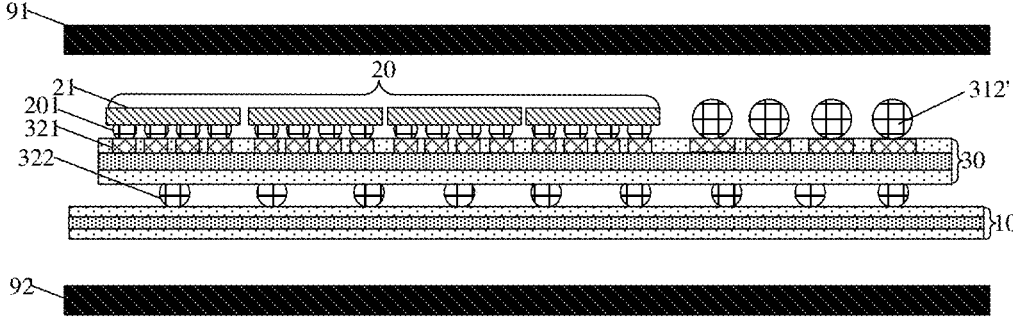

Next, referring to FIG. 6C, the first packaging mold 91 and the second packaging mold 92 are formed. The first packaging mold and the second packaging mold in this embodiment are the same as the first packaging mold and the second packaging mold shown in FIG. 5A to FIG. 5H, which are not described herein again.

Figure 6D:
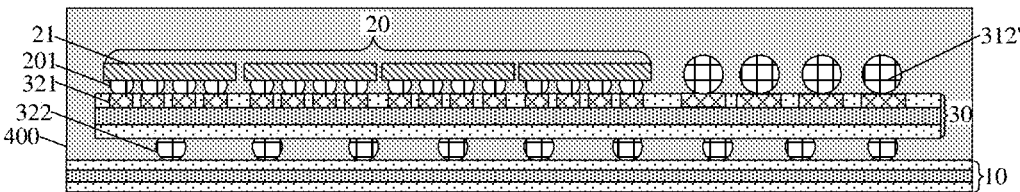

Next, referring to FIG. 6D, the first packaging mold 91 and the second packaging mold 92 are used as masks, to form the molding compound pre-layer 400. The molding compound pre-layer 400 completely covers the first surface of the base plate 10, the first chip structure 20, the intermediary layer 30, and the initial first solder ball 312' on the intermediary layer 30.

After the molding compound pre-layer 400 is formed, the first packaging mold 91 and the second packaging mold 92 are removed.

Figure 6E:
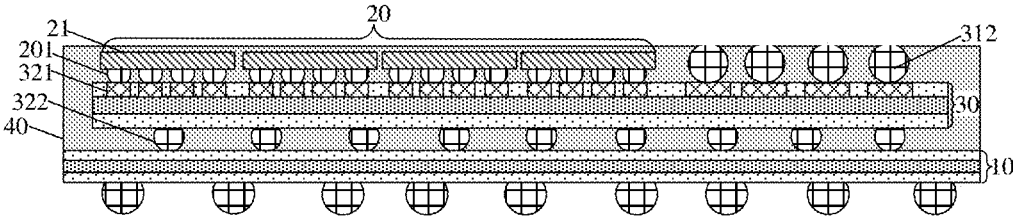

Next, referring to FIG. 6E, part of the molding compound pre-layer 400 is removed to form the molding compound 40, and part of the initial first solder ball 312' is also removed, so as to form the first solder ball 312 with the preset height h.

Continuously referring to FIG. 6E, after the molding compound 40 is formed, the connection bump 17 of the base plate is formed on the second surface 102 of the base plate 10. The connection bump 17 of the base plate includes a conductive material.

Figure 6F:
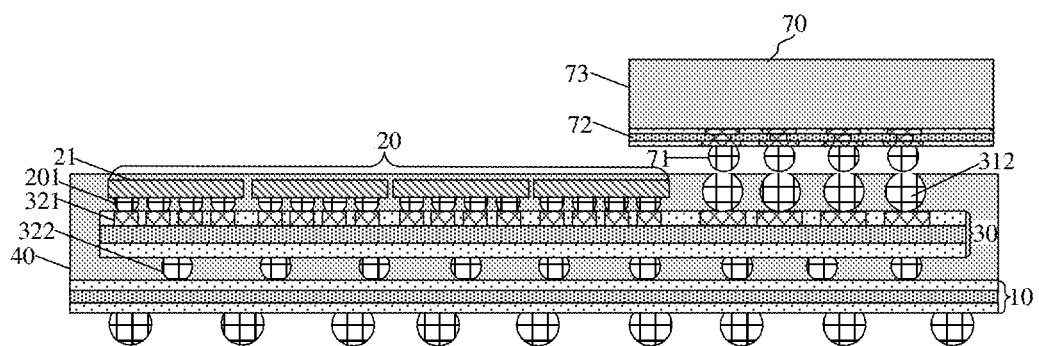

Next, referring to FIG. 6F, the second package structure 70 is formed. The second package structure 70 includes a second solder ball 71 and is electrically connected to the first solder ball 312 by means of the second solder ball 71.

The second package structure in this embodiment is the same as the second package structure shown in FIG. 5A to FIG. 5H, which is not described herein again.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

INDUSTRIAL APPLICABILITY

In the embodiments of the disclosure, through the arrangement of the intermediary layer, the second package structure to be formed subsequently may be connected to the first chip structure and the base plate by means of the first solder ball on the intermediary layer. Therefore, the interconnection between the structures of different types or different specifications can be realized, such that a combination between different structures can be more flexible. In addition, since the first chip structure and the second package structure are packaged separately, it is easier to perform testing and failure analysis. As there is the preset height between the top surface of the first solder ball and the first interconnection surface, it is guaranteed that the package structure has a relatively thin overall thickness, while the entire package structure can have relatively good bonding force with the second package structure to be formed subsequently.

The invention claimed is:

1. A semiconductor package assembly, comprising:
a base plate, having a first surface, the base plate comprises a first signal transmission region and a second signal transmission region that are respectively located on two opposite ends of the base plate, the first signal transmission region and the second signal transmission region are not connected to each other, the base plate further comprising a third signal transmission region located between the first signal transmission region and the second signal transmission region, the first signal transmission region and the third signal transmission region are connected to each other, the third signal transmission region and the second signal transmission region are not connected to each other;
a first chip structure, located on the third signal transmission region, and electrically connected to the first signal transmission region;
an intermediary layer, located above the first chip structure, having a first interconnection surface, wherein the first interconnection surface has a first interconnection region and a second interconnection region, a first solder ball is formed on the first interconnection region, a first pad is formed on the second interconnection region, and the intermediary layer is electrically connected to the second signal transmission region by means of the first pad;
a molding compound, sealing the first chip structure, the intermediary layer and the first surface of the base plate, wherein the first solder ball has a surface exposed from the molding compound, and there is a preset height between the exposed surface of the first solder ball and the first interconnection surface of the intermediary layer.

2. The semiconductor package assembly of claim 1, wherein the first chip structure comprises a plurality of first semiconductor chips that are successively stacked in a direction perpendicular to the base plate; and wherein the intermediary layer is located on the first chip structure, the semiconductor package assembly further comprising: a second package structure, comprising a second solder ball and electrically connected to the first solder ball by means of the second solder ball, wherein a volume of the first solder ball is greater than a volume of the second solder ball.

3. The semiconductor package assembly of claim 2, further comprising:

the first semiconductor chip has a first connection end, the first connection end and the first signal transmission region are located on the same side, a first conductive wire is led out from the first connection end and electrically connected to the first signal transmission region; and a second conductive wire is led out from the first pad and electrically connected to the second signal transmission region, the first pad and the second signal transmission region are located on the same side.

4. The semiconductor package assembly of claim 2, wherein a plurality of second pads are formed on the first interconnection region; a number of the first pads is greater than a number of the second pads; and an area of the first pad is less than an area of the second pad.

5. The semiconductor package assembly of claim 2, wherein the molding compound has a first thickness in a direction perpendicular to the base plate; and wherein the second package structure comprises a second molding compound; the second molding compound has a second thickness in the direction perpendicular to the base plate; and the first thickness is greater than or equal to the second thickness.

6. The semiconductor package assembly of claim 1, wherein the first chip structure only electrically connected to the first signal transmission region, the intermediary layer is only electrically connected to the second signal transmission region.

7. The semiconductor package assembly of claim 1, wherein the preset height between the top surface of the first solder ball and the first interconnection surface is not less than ⅓-½ of a thickness of the intermediary layer.

8. The semiconductor package assembly of claim 1, wherein a thickness of the intermediary layer ranges from 100 μm to 200 μm, the preset height ranges from 50 μm to 120 μm.

9. A method for manufacturing a semiconductor package assembly, comprising:

providing a base plate, wherein the base plate has a first surface, the base plate comprises a first signal transmission region and a second signal transmission region that are respectively located on two opposite ends of the base plate, the first signal transmission region and the second signal transmission region are not connected to each other, the base plate further comprising a third signal transmission region located between the first signal transmission region and the second signal transmission region, the first signal transmission region and the third signal transmission region are connected to each other, the third signal transmission region and the second signal transmission region are not connected to each other;

forming a first chip structure on the third signal transmission region, wherein the first chip structure is electrically connected to the first signal transmission region;

forming an intermediary layer, located above the first chip structure, wherein the intermediary layer has a first interconnection surface, the first interconnection surface has a first interconnection region and a second interconnection region, a first solder ball is formed on the first interconnection region, a first pad is formed on the second interconnection region, and the intermediary layer is electrically connected to the second signal transmission region by means of the first pad;

forming a molding compound, wherein the molding compound seals the first chip structure, the intermediary layer and the first surface of the base plate, the first solder ball has a surface exposed from the molding compound, and there is a preset height between the exposed surface of the first solder ball and the first interconnection surface of the intermediary layer.

10. The method of claim 9, wherein the forming a first chip structure comprises:

forming a plurality of first semiconductor chips that are successively stacked in a direction perpendicular to the base plate; and wherein the intermediary layer is formed on the first chip structure, the method further comprising: forming a second package structure, wherein the second package structure comprises a second solder ball and is electrically connected to the first solder ball by means of the second solder ball, a volume of the first solder ball is greater than a volume of the second solder ball.

11. The method of claim 10, further comprising: after forming the intermediary layer, forming a first conductive wire, wherein each of the first semiconductor chips is electrically connected to the base plate by means of the first conductive wire; and forming a second conductive wire, wherein the second interconnection region is electrically connected to the base plate by means of the second conductive wire.

12. The method of claim 10, further comprising:

forming a plurality of second pads on the first interconnection region, wherein a number of the first pads is greater than a number of the second pads; and an area of the first pad is less than an area of the second pad.

13. The method of claim 10, wherein the molding compound has a first thickness in a direction perpendicular to the base plate; and wherein the second package structure comprises a second molding compound; the second molding compound has a second thickness in the direction perpendicular to the base plate; and the first thickness is greater than or equal to the second thickness.

14. The method of claim 9, wherein the forming a molding compound comprises:

forming a first packaging mold, wherein a surface of the first packaging mold is parallel to a surface of the base plate, and the first packaging mold is located above the first chip structure and the intermediary layer, and there is a certain distance from the first packaging mold to the first chip structure and the intermediary layer;

forming a molding compound pre-layer by using the first packaging mold as a mask; and removing part of the molding compound pre-layer to form the molding compound and expose a surface of the first solder ball.

15. The method of claim 14, further comprising: an initial first solder ball is first formed on the first interconnection region of the intermediary layer, the molding compound seals the initial first solder ball, when part of the molding compound pre-layer removed, part of the initial first solder ball is also removed, forming the first solder ball.

16. A semiconductor package assembly, comprising:

a base plate, having a first surface, the base plate comprises a first signal transmission region and a second signal transmission region that are respectively located on two opposite ends of the base plate, the first signal transmission region and the second signal transmission region are not connected to each other;

a first chip structure, located on the base plate and electrically connected to the first surface of the base plate, wherein the first chip structure comprises a plurality of first semiconductor chips that are successively stacked in a direction perpendicular to base plate; 5 an intermediary layer, located above the first chip structure, having a first interconnection surface, wherein the first interconnection surface has a first interconnection region and a second interconnection region, a first solder ball is formed on the first interconnection region, a first pad is formed on the second interconnection region, wherein the first semiconductor chips have a first connection end, the first connection end and the first signal transmission region are located on the same side; 10 15 a first conductive wire and a second conductive wire, the first conductive wire is led out from the first connection end and only connected to the first signal transmission region, the second conductive wire is led out from the first pad and only connected to the second signal transmission region; 20 a molding compound, sealing the first chip structure, the intermediary layer and the first surface of the base plate, wherein the first solder ball has a surface exposed from the molding compound, and there is a preset height between the exposed surface of the first solder ball and the first interconnection surface of the intermediary layer. 25 30

\*    \*    \*    \*    \*